United States Patent
Kang et al.

(10) Patent No.: US 7,607,056 B2
(45) Date of Patent: Oct. 20, 2009

(54) SEMICONDUCTOR TEST APPARATUS FOR SIMULTANEOUSLY TESTING PLURALITY OF SEMICONDUCTOR DEVICES

(75) Inventors: Jong Koo Kang, Suwon (KR); Sun Whan Kim, Yongin (KR)

(73) Assignee: UniTest Inc., Yongin (KR)

( * ) Notice: Subject to any disclaimer, the term of this patent is extended or adjusted under 35 U.S.C. 154(b) by 710 days.

(21) Appl. No.: 11/152,073

(22) Filed: Jun. 15, 2005

(65) Prior Publication Data
US 2005/0283697 A1    Dec. 22, 2005

(30) Foreign Application Priority Data
Jun. 18, 2004    (KR)    ............ 10-2004-0045421
Jun. 18, 2004    (KR)    ............ 10-2004-0045422

(51) Int. Cl.
*G01R 31/28*    (2006.01)

(52) U.S. Cl. ............ 714/724; 714/736; 714/738; 714/726; 714/25; 714/718; 714/735; 714/740; 714/742; 714/745; 324/765; 324/754; 324/158.1; 702/120; 702/121; 702/118

(58) Field of Classification Search ............ None
See application file for complete search history.

(56) References Cited

U.S. PATENT DOCUMENTS

| | | | | |
|---|---|---|---|---|
| 3,597,682 A * | 8/1971 | Hubbs et al. | ............ | 324/72.5 |
| 4,517,512 A * | 5/1985 | Petrich et al. | ............ | 714/724 |
| 4,760,329 A * | 7/1988 | Andreano | ............ | 714/32 |
| 5,581,177 A * | 12/1996 | Hussey et al. | ............ | 324/158.1 |
| 5,600,257 A * | 2/1997 | Leas et al. | ............ | 324/754 |
| 5,841,787 A * | 11/1998 | Warring et al. | ............ | 714/718 |
| 6,014,764 A | 1/2000 | Graeve et al. | | |
| 6,075,374 A * | 6/2000 | Dakeyama | ............ | 324/754 |
| 6,256,760 B1 * | 7/2001 | Carron et al. | ............ | 714/726 |
| 6,275,962 B1 * | 8/2001 | Fuller et al. | ............ | 714/724 |
| 6,462,532 B1 * | 10/2002 | Smith | ............ | 324/158.1 |
| 6,545,493 B1 * | 4/2003 | Iino | ............ | 324/754 |
| 6,594,802 B1 | 7/2003 | Ricchetti et al. | | |
| 6,622,103 B1 * | 9/2003 | Miller | ............ | 702/89 |
| 6,622,272 B1 | 9/2003 | Haverkamp et al. | | |
| 6,625,557 B1 * | 9/2003 | Perkins et al. | ............ | 702/117 |
| 6,625,558 B1 * | 9/2003 | Van Ausdall et al. | ............ | 702/117 |
| 6,704,897 B1 * | 3/2004 | Takagi | ............ | 714/739 |
| 6,883,128 B2 | 4/2005 | Kang et al. | | |
| 6,941,243 B1 * | 9/2005 | Maciona et al. | ............ | 702/182 |
| 6,998,863 B1 * | 2/2006 | Miller | ............ | 324/758 |
| 7,019,547 B2 * | 3/2006 | Aghaeepour | ............ | 324/765 |
| 7,058,865 B2 * | 6/2006 | Mori et al. | ............ | 714/724 |
| 7,068,942 B2 * | 6/2006 | Hofmeister et al. | ............ | 398/135 |
| 7,092,837 B1 * | 8/2006 | Lanier et al. | ............ | 702/117 |
| 7,103,761 B2 * | 9/2006 | Larson et al. | ............ | 713/1 |
| 7,117,410 B2 * | 10/2006 | Borders | ............ | 714/723 |
| 7,145,489 B2 * | 12/2006 | Chun | ............ | 341/120 |
| 7,173,438 B2 * | 2/2007 | Pooranakaran et al. | ............ | 324/678 |
| 7,191,368 B1 * | 3/2007 | Organ et al. | ............ | 714/57 |
| 7,206,947 B2 * | 4/2007 | Krishnamurthy et al. | ............ | 713/320 |
| 7,272,774 B2 * | 9/2007 | Co et al. | ............ | 714/764 |
| 7,375,542 B2 * | 5/2008 | Teneketges | ............ | 324/765 |

(Continued)

*Primary Examiner*—John P Trimmings
(74) *Attorney, Agent, or Firm*—Sughrue Mion, PLLC

(57) ABSTRACT

Disclosed herein is a semiconductor test apparatus for simultaneously testing a plurality of semiconductor devices. The semiconductor test apparatus includes a plurality of pattern generation boards, a DUT board, a backplane board, and a power supply unit.

6 Claims, 7 Drawing Sheets

U.S. PATENT DOCUMENTS

| | | | |
|---|---|---|---|
| 2002/0118007 A1* | 8/2002 | Mori et al. | 324/158.1 |
| 2003/0046476 A1* | 3/2003 | Chong | 710/316 |
| 2003/0062888 A1* | 4/2003 | Magliocco et al. | 324/158.1 |
| 2003/0099139 A1* | 5/2003 | Abrosimov et al. | 365/200 |
| 2003/0117162 A1* | 6/2003 | Watts | 324/765 |
| 2003/0189430 A1* | 10/2003 | Nuessle | 324/504 |
| 2003/0208711 A1* | 11/2003 | Frame et al. | 714/742 |
| 2003/0217345 A1* | 11/2003 | Rajsuman et al. | 716/6 |
| 2004/0066207 A1* | 4/2004 | Bottoms et al. | 324/754 |
| 2004/0068699 A1* | 4/2004 | Morris et al. | 716/4 |
| 2004/0186675 A1* | 9/2004 | Larson et al. | 702/91 |
| 2004/0187060 A1* | 9/2004 | Rohrbaugh et al. | 714/742 |
| 2004/0232930 A1* | 11/2004 | Shibuya et al. | 324/754 |
| 2005/0033949 A1* | 2/2005 | Herrmann et al. | 713/1 |
| 2005/0099174 A1* | 5/2005 | Siade et al. | 324/158.1 |
| 2006/0001435 A1* | 1/2006 | Teneketges | 324/754 |
| 2006/0047463 A1* | 3/2006 | Sivaram et al. | 702/120 |
| 2006/0087462 A1* | 4/2006 | Chun | 341/120 |
| 2007/0011690 A1* | 1/2007 | Gilet | 719/328 |
| 2008/0022165 A1* | 1/2008 | McKim et al. | 714/712 |

\* cited by examiner

<Related Art>

SEMICONDUCTOR TEST APPARATUS FOR SIMULTANEOUSLY TESTING PLURALITY OF SEMICONDUCTOR DEVICES

RELATED APPLICATIONS

The present disclosure relates to subject matter contained in priority Korean Application No. 10-2004-0045421 and 10-2004-0045422, filed on 18 Jun. 2004, which are herein expressly incorporated by reference in its entirety.

BACKGROUND OF THE INVENTION

1. Field of the Invention

The present invention relates, in general, to a semiconductor test apparatus for simultaneously testing a plurality of semiconductor devices and, more particularly, to a semiconductor test apparatus for simultaneously testing a plurality of semiconductor devices, which mainly performs cell and core tests and a direct current test that are most important and require the longest test time among memory tests, except for memory tests having complicated functions in a conventional memory module or memory component, for example, an alternating current margin test or timing generator, and which, in particular, simplifies the construction of conventional automated test equipment in a function test using test patterns and utilizes a programmable device, in which functions, such as pattern generation or comparison or signal application, are implemented on one chip, thus miniaturizing a semiconductor test apparatus and reducing the production cost thereof.

2. Description of the Related Art

Generally, a memory tester is designed and developed according to the status of a memory device, in particular, the development status of Dynamic Random Access Memory (DRAM) occupying considerable part of memory devices. Recently, DRAM has been developed into DRAM having an Extended Data Output (EDO) function, a Synchronous DRAM (SDRAM), Rambus DRAM (RDRAM), and, subsequently, Double Data Rate (DDR) DRAM.

In order to test such DRAM, a memory tester also requires high speed and high precision to correspond to the high speed of the memory. Further, a test duration increases as the capacity of memory increases, so that a test speed must also increase. Further, a miniaturized and economical memory tester must be implemented to reduce the cost of testing.

Typically, a memory tester is an apparatus used to test and inspect a memory component, or a memory module implemented in the form of a Single In-line Memory Module (SIMM) or Dual In-line Memory Module (DIMM). Such a memory tester determines whether a functional defect exists in a memory module or memory component before the memory module or memory component is mounted and used in an actual computer system, etc.

A memory tester can be classified into a hardware memory tester and a software diagnostic program executed in a Personal Computer (PC) environment. However, since the software diagnostic program diagnoses the status of a memory module or component that is mounted and used in an actual computer, the hardware memory tester is mainly used in a semiconductor memory manufacturing process.

Such a hardware memory tester can be classified into a high-end tester called Automated Test Equipment (ATE), a medium range memory tester and a low-end memory tester.

The ATE is typically used to execute a memory test process. In FIG. 1, a conceptual view of a semiconductor test apparatus that can be considered as a conventional typical memory tester is shown.

As shown in FIG. 1, a conventional semiconductor test apparatus 100 includes a power unit 110 for supplying a power voltage to a semiconductor device (module or component) 180 to be tested, a driver 120 for inputting a signal to the input unit of the semiconductor device 180, a comparator 130 for comparing a signal output from the output unit of the semiconductor device 180 with an expected signal, a pattern generator 140 for generating a signal sequence (test pattern) to be input to the semiconductor device 180 and the expected signal, a timing generator 150 for generating application timing for the signal to be input to the semiconductor device 180, and a Central Processing Unit (CPU) 160 which is a controller for controlling the above circuits. The CPU 160 is constructed to read a test program from an external storage device, generate and determine a test signal (test pattern) while analyzing the test program using an Operating System (OS), and perform a predetermined test. In the test apparatus 100, a separate Direct Current (DC) test circuit 170 may occasionally be installed to perform a DC test, such as the detection of the voltage level of the output unit.

Such a conventional memory tester is disadvantageous in that it performs a DC test for examining whether DC parameters are suitable for the digital operation of the circuit and an Alternating Current (AC) margin test related to the transfer delay time, set-up time and hold time of signals, has various functions, such as a timing generator, for these tests, and is produced using bulky and expensive dedicated equipment, such as a mainframe, thus increasing the production cost.

In a semiconductor manufacturing company, it is preferable to efficiently design expensive ATE so as to minimize the production cost of devices and improve competitiveness. Therefore, it is preferable to miniaturize ATE and reduce the production cost thereof by efficiently designing the ATE.

SUMMARY OF THE INVENTION

Accordingly, the present invention has been made keeping in mind the above problems occurring in the prior art, and an object of the present invention is to provide a semiconductor test apparatus for simultaneously testing a plurality of semiconductor devices, which mainly performs cell and core tests and a direct current test that are most important and require the longest test time among memory tests, except for memory tests having complicated functions in a conventional memory module or memory component, for example, an alternating current margin test or timing generator, and which, in particular, simplifies the construction of conventional automated test equipment in a function test using test patterns and utilizes a programmable device, in which functions, such as pattern generation or comparison or signal application, are implemented on one chip, thus miniaturizing a semiconductor test apparatus and reducing the production cost thereof.

In order to accomplish the above object, the present invention provides a semiconductor test apparatus for simultaneously testing a plurality of semiconductor devices, comprising: a plurality of pattern generation boards for receiving a test program from an external server, generating a test pattern signal and an expected signal, transmitting the test pattern signal to the semiconductor devices, receiving a test pattern result signal from the semiconductor devices, comparing the test pattern result signal with the expected signal, generating a Direct Current (DC) test signal and a DC test expected signal for a DC test, transmitting the DC test signal to the semiconductor devices, and receiving a DC test result signal from the semiconductor devices, comparing the DC test result signal with the DC test expected signal; a Device Under Test (DUT) board including a plurality of sockets for connection to the semiconductor devices and a plurality of connectors for connection to the pattern generation boards, the DUT board receiving the test pattern signal or the DC test signal from the pattern generation boards, transmitting the test pattern signal or DC test signal to the semiconductor devices, receiving the test pattern result signal or DC test result signal from the semiconductor devices, and transmitting the test pattern result signal or DC test result signal to the pattern generation boards; a backplane board including a plurality of connectors for connection to the plurality of pattern generation boards, the backplane board mechanically supporting the pattern generation boards, the backplane board including a communication interface unit for connection to the external server; and a power supply unit for mechanically supporting the backplane board and supplying power to the backplane board, wherein the power supply unit comprises: a plurality of programmable power supply units for supplying power having a plurality of voltages, each of the plurality of programmable power supply units being connected to a power interface unit of the backplane board; a power board for controlling supply of power to the plurality of programmable power supply units, the power board mechanically supporting the programmable power supply units; and a DC power source for supplying DC power to the power board.

Preferably, each of the pattern generation boards may comprise a programmable device for receiving the test program, generating the test pattern signal and the expected signal, transmitting the test pattern signal to a corresponding semiconductor device, receiving the test pattern result signal from the semiconductor device, and comparing the test pattern result signal with the expected signal, thus testing operation of the semiconductor device, a power measurement unit for generating the DC test signal and the DC test expected signal to perform the DC test, transmitting the DC test signal to the semiconductor device, receiving the DC test result signal from the semiconductor device and performing comparison with the DC test expected signal, a DUT interface unit including a test pattern interface that transmits the test pattern signal to the semiconductor device while minimizing signal distortion, receives the test pattern result signal from the semiconductor device and transmits the test pattern result signal to the programmable device, a power interface that transmits the DC test signal to the semiconductor device, receives the DC test result signal from the semiconductor device and transmits the DC test result signal to the power measurement unit, and a termination interface that performs termination, a clock generator for generating a clock and providing the clock to the programmable device, a Phase Locked Loop (PLL) for transmitting a clock signal having the same phase to the DUT interface unit, a backplane interface unit for providing an interface with the backplane board to communicate with the external server and to be supplied with power from the power supply unit, and a control unit for controlling operation of the programmable device, the power measurement unit, the DUT interface unit, the clock generator, the PLL and the backplane interface unit.

Preferably, the control unit may perform control so that the power interface of the DUT interface unit is set to be ON and the test pattern interface and the termination interface are set to be OFF when the DC test is performed, and the power interface of the DUT interface unit is set to be OFF and the test pattern interface and the termination interface are set to be ON when a function test is performed.

Preferably, the communication interface unit may be an interface satisfying a Peripheral Component Interconnect (PCI) communication standard.

Preferably, the DUT board may comprise a plurality of sockets in which semiconductor modules are mounted, the semiconductor devices may be the semiconductor modules, and the plurality of connectors of the DUT board for connection to the pattern generation boards may interface the pattern generation boards with the sockets, in which the semiconductor modules are mounted and which correspond to respective pattern generation boards, to transmit/receive signals.

Preferably, the DUT board may comprise a plurality of sockets in which semiconductor components are mounted, the semiconductor devices may be the semiconductor components, and the plurality of connectors of the DUT board for connection to the pattern generation boards may interface the pattern generation boards with semiconductor components designated with respect to the pattern generation boards through cable connections to transmit/receive signals.

DESCRIPTION OF THE PREFERRED EMBODIMENTS

Hereinafter, embodiments of a semiconductor test apparatus for simultaneously testing a plurality of semiconductor devices according to the present invention will be described in detail with reference to the attached drawings.

Figure 2:
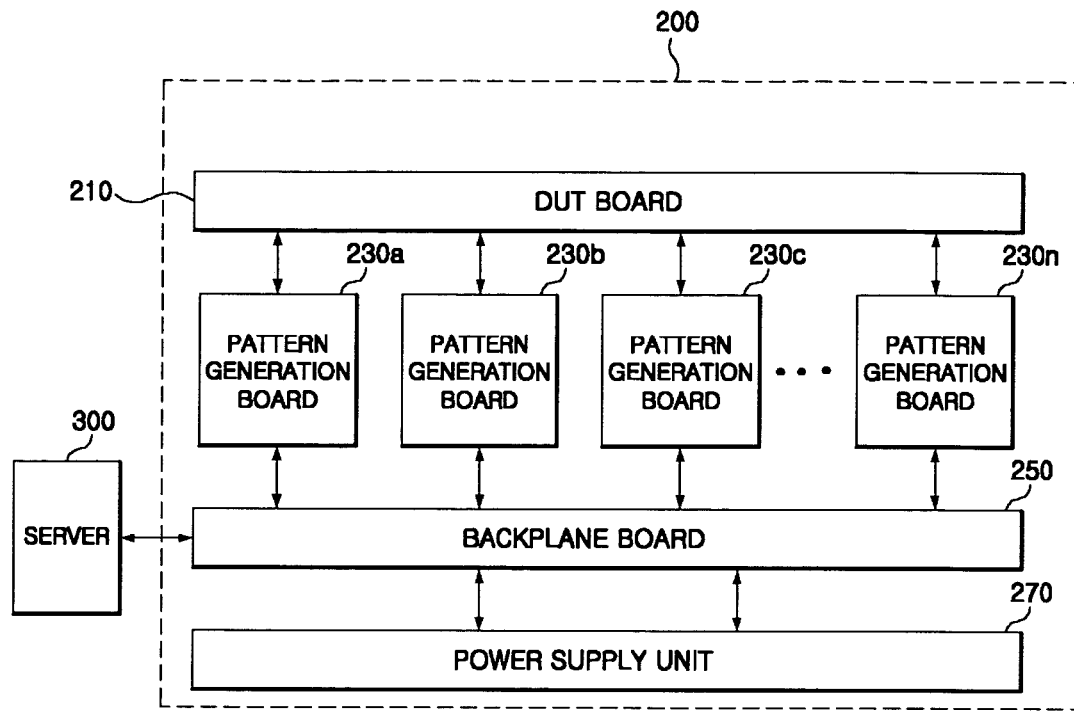
FIG. 2 is a view showing the construction of a semiconductor test apparatus for simultaneously testing a plurality of semiconductor devices according to the present invention.

FIG. 2 is a view showing a simplified construction of a semiconductor test apparatus according to the present invention. As shown in FIG. 2, a semiconductor test apparatus 200 according to the present invention includes a Device Under Test (DUT) board 210, a plurality of pattern generation boards 230a to 230n, a backplane board 250 and a power supply unit 270. Further, the semiconductor test apparatus 200 of the present invention may be connected to an external server 300.

The external server 300 provides a predetermined user interface and thus provides an environment allowing a user to create a test program that meets the characteristics of semiconductor devices (modules or components) to be tested. Further, the server 300 can provide a user interface allowing the test program to be transmitted to the semiconductor test apparatus 200, and allowing test results to be received from the semiconductor test apparatus 200 and to be analyzed after a function test or DC test has been performed by the semiconductor test apparatus 200.

The external server 300 and the semiconductor test apparatus 200 may be connected to each other through a predetermined interface. For example, they can be connected to each other using the backplane board 250 and a Peripheral Component Interconnect (PCI) interface.

The DUT board 210 includes a plurality of sockets for connection to semiconductor devices to be tested and a plurality of connectors for connection to the pattern generation boards 230a to 230n. The semiconductor devices may be mounted in the sockets of the DUT board 210 either using a handler or manually. The DUT board 210 functions as an interface for signal transmission/reception between the semiconductor devices and the plurality of pattern generation boards 230a to 230n.

The pattern generation boards 230a to 230n are implemented as identical pattern generation boards. Each pattern generation board generates a series of signals required to test the semiconductor devices, that is, a test pattern signal and an expected signal, using the test program received from the external server 300, and transmits the test pattern signal to the semiconductor device through the DUT board 210. Further, each pattern generation board compares a test pattern result signal transmitted from a corresponding semiconductor device through the DUT board 210 with the expected signal, and tests the operation of the semiconductor device. Further, for the DC test, each pattern generation board generates a DC test signal and a DC test expected signal, transmits the DC test signal to a corresponding semiconductor device through the DUT board 210, measures a DC test result signal transmitted from the semiconductor device through the DUT board 210 and tests the DC characteristics of the semiconductor device.

Each pattern generation board is implemented by simplifying the construction of conventional ATE so as to mainly perform cell and core tests and a DC test that are most important and require the longest test time among memory tests, except for tests having complicated functions, such as an AC margin test or a timing generator of the conventional ATE. In particular, each pattern generation board is implemented by simplifying construction using a programmable device, in which functions, such as pattern generation or comparison, or signal application, are implemented on one chip, in a function test using test patterns.

The backplane board 250 includes a plurality of connectors for connection to the plurality of pattern generation boards 230a to 230n. Further, the backplane board 250 provides an interface for receiving the test program from the external server 300, receiving test results compared by the pattern generation boards 230a to 230n and transmitting the test results to the external server 300.

The power supply unit 270 functions to supply power having a plurality of voltages required for the DUT board 210, the pattern generation boards 230a to 230n, and the backplane board 250.

Figure 3A:
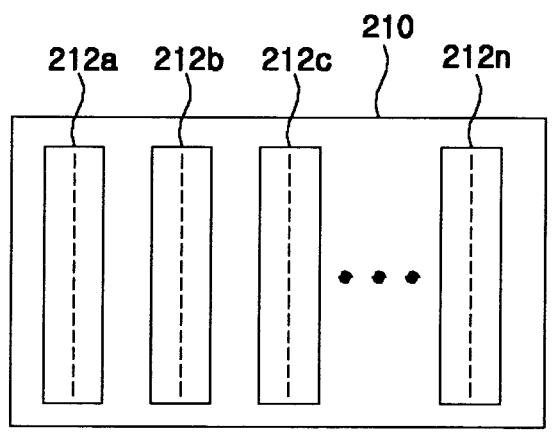
FIGS. 3a to 3c are views showing exemplary constructions of a DUT board of the semiconductor test apparatus for simultaneously testing a plurality of semiconductor devices according to the present invention.
Figure 3B:
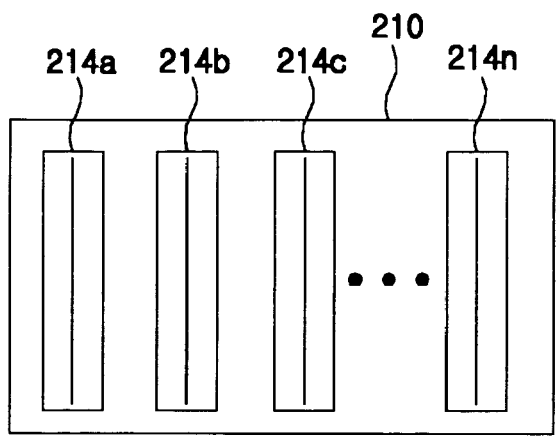
Figure 3C:
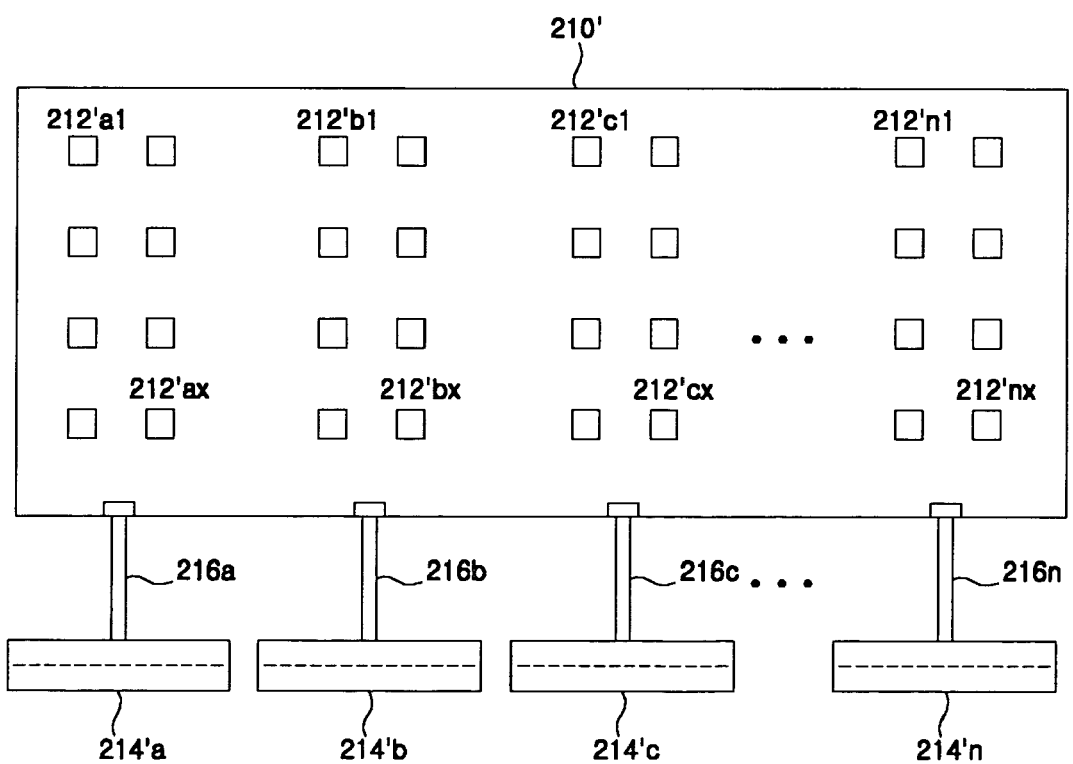

FIGS. 3a to 3c are views showing exemplary constructions of the DUT board of the semiconductor test apparatus according to the present invention. FIGS. 3a and 3b illustrate the top and bottom surfaces of the DUT board 210 when semiconductor modules are tested, and FIG. 3c illustrates a DUT board 210' when semiconductor components are tested.

As shown in FIGS. 3a and 3b, the DUT board 210 includes a plurality of sockets 212a to 212n for connection to semiconductor modules and a plurality of connectors 214a to 214n for connection to the pattern generation boards 230a to 230n when the semiconductor modules are tested.

Further, as shown in FIG. 3c, the DUT board 210' includes a plurality of sockets 212'a1 and 212'nx for connection to semiconductor components and a plurality of connectors 214'a to 214'n for connection to the pattern generation boards 230a to 230n when the semiconductor components are tested.

The connectors 214'a to 214'n are connected to the DUT board 210' using, for example, cables 216a to 216n, respectively, and constructed to interface the pattern generation boards with semiconductor components corresponding thereto so as to transmit signals.

For example, the connector 214'a interfaces sockets 212'a1 to 212'ax, used to test semiconductor components, with a pattern generation board so as to transmit signals. Similar to this, the connector 214'n interfaces sockets 212'n1 to 212'nx, used to test semiconductor components, with a pattern generation board so as to transmit signals.

The DUT board 210 or 210' functions as an interface that makes a stable connection between semiconductor devices and pattern generation boards 230a to 230n. That is, the DUT board 210 or 210' functions to transmit a test pattern signal or DC test signal, generated by the pattern generation boards 230a to 230n, to the semiconductor devices without causing signal distortion, and functions to mechanically support the sockets so as to allow the semiconductor devices to be precisely mounted in the sockets. Further, the DUT board 210 or 210' functions as an interface that receives a test pattern result signal or DC test result signal output from the semiconductor devices and transmits the test pattern result signal or DC test result signal to the plurality of pattern generation boards 230a to 230n.

Figure 4:
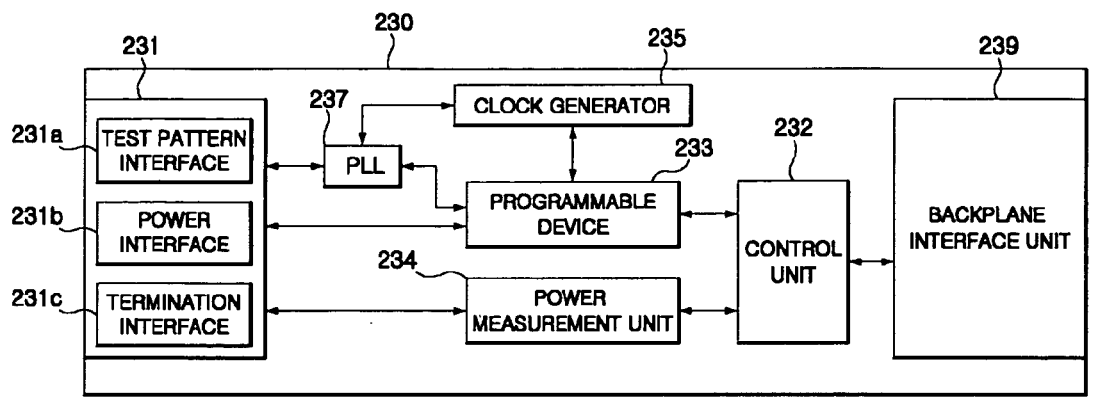
FIG. 4 is a view showing an exemplary construction of a pattern generation board of the semiconductor test apparatus for simultaneously testing a plurality of semiconductor devices according to the present invention.

FIG. 4 is a view showing an exemplary construction of a pattern generation board of the semiconductor test apparatus according to the present invention.

As shown in FIG. 4, a pattern generation board 230 includes a DUT interface unit 231, a control unit 232, a programmable device 233, a power measurement unit 234, a clock generator 235, a Phase Locked Loop (PLL) 237 and a backplane interface unit 239.

The DUT interface unit 231 for an interface with the DUT board 210 includes a test pattern interface 231a that transmits a test pattern signal, generated by the programmable device 233, to a corresponding semiconductor device through one of the connectors 214a to 214n and one of the sockets 212a to 212n of the DUT board 210 while minimizing signal distortion, and transmits a test pattern result signal output from the semiconductor device to the pattern generation board 230, a power interface 231b that transmits a DC test signal generated by the power measurement unit 234 to the semiconductor device through one of the connectors 214a to 214n and one of the sockets 212a to 212n of the DUT board 210 and transmits test results output from the semiconductor device to the pattern generation board 230, and a termination interface 231c that performs impedance matching, etc.

The programmable device 233 can be implemented using a device, such as a Programmable Logic Device (PLD) or Field Programmable Gate Array (FPGA). The programmable device 233 is programmed to receive the test program from the external server 300, generate the test pattern signal and expected signal, transmit the test pattern signal to the semiconductor device, receive the test result signal output from the semiconductor device, and compares the test result signal with the expected signal, thus testing the operation of the semiconductor device.

Figure 1:
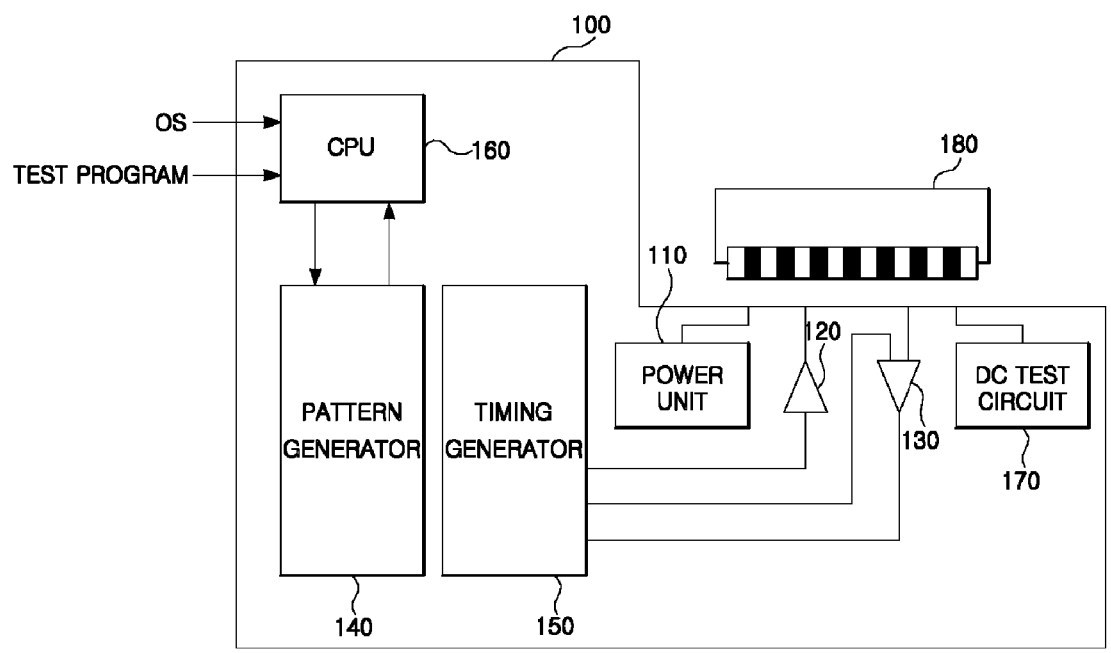
FIG. 1 is an exemplary diagram of a conventional semiconductor test apparatus.

Referring to FIGS. 1 and 4, the programmable device 233 is implemented in such a way that the functions of a driver 120 for inputting a signal to an input unit, a comparator 130 for comparing a signal output from the output unit of a semiconductor module with an expected signal, and a pattern generator 140 for generating a signal sequence (test pattern), input to the semiconductor module, and the expected signal, are implemented on one chip in the form of an FPGA or PLD and included in the pattern generation board, but the driver 120, the comparator 130 and the pattern generator 140 were included in ATE as separate components in the prior art. Therefore, the programmable device 233 can be miniaturized and produced at low cost. Further, the programmable device 233 may include therein a control program for the PLL 237 or power supply. Further, the programmable device 233 may include therein a program for performing control to transmit a generated test pattern signal to the semiconductor device.

The power measurement unit 234 is a device for applying voltage and measuring current, or a device for applying current and measuring voltage. That is, the power measurement unit 234 generates a DC test signal and a DC test expected signal for a DC test, transmits the DC test signal to the semiconductor device, receives a DC test result signal output from the semiconductor device and compares the DC test result signal with the DC test expected signal. For these operations, the power measurement unit 234 may include a Digital to Analog Converter (DAC) and an Analog to Digital Converter (ADC).

The clock generator 235 generates a reference clock and provides the clock to both the programmable device 233 and the PLL 237.

The PLL 237 causes the phase difference between a clock signal received from the programmable device 233 and the signal fed back from the clock generator 235 to be "0", thus transmitting a clock signal having the same phase to the DUT interface unit 231.

The backplane interface unit 239 functions to provide an interface with the backplane board 250, and can communicate with the external server 300 and be supplied with power from the power supply unit 270 through the backplane board 250.

The control unit 232 controls the operation of respective components. For example, when a test is performed using a test pattern signal, the control unit 232 performs a control operation so that the test pattern interface 231a and the termination interface 231c are set to be ON and the power interface 231b is set to be OFF, thus performing the function test. Further, when a DC test is performed, the control unit 232 performs a control operation so that the test pattern interface 231a and the termination interface 231c are set to be OFF and the power interface 231b is set to be ON, thus performing the DC test.

Figure 5:
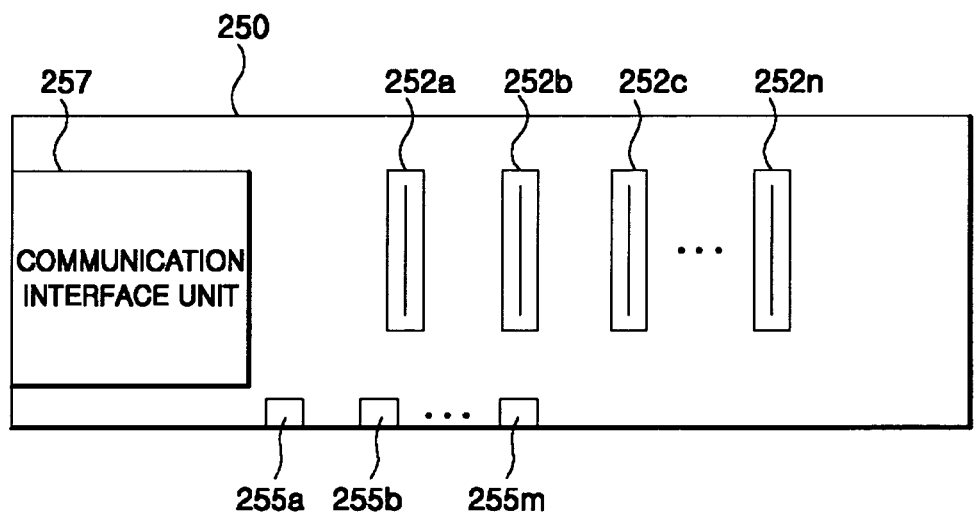
FIG. 5 is a view showing an exemplary construction of a backplane board of the semiconductor test apparatus for simultaneously testing a plurality of semiconductor devices according to the present invention.

FIG. 5 is a view showing an exemplary construction of a backplane board of the semiconductor test apparatus according to the present invention. As shown in FIG. 5, the backplane board 250 includes a plurality of connectors 252a to 252n for connection to the pattern generation boards 230a to 230n and a plurality of power interface units 255a to 255m for connection to the power supply unit 270, and also includes a communication interface unit 257 for connection to the external server 300.

The backplane board 250 functions to transmit power supplied by the power supply unit 270 to the pattern generation boards 230a to 230n through the power interface units 255a to 255m. Further, the backplane board 250 functions to provide a communication interface with the external server 300, thus receiving a test program from the external server 300 and transmitting function test and DC test results to the external server 300.

The communication interface unit 257 can provide an interface satisfying, for example, a PCI communication standard. The transmission/reception of data, such as the test program or test results, between the external server 300 and the semiconductor test apparatus of the present invention can be performed through the communication interface unit 257 satisfying the PCI communication standard.

Figure 6:
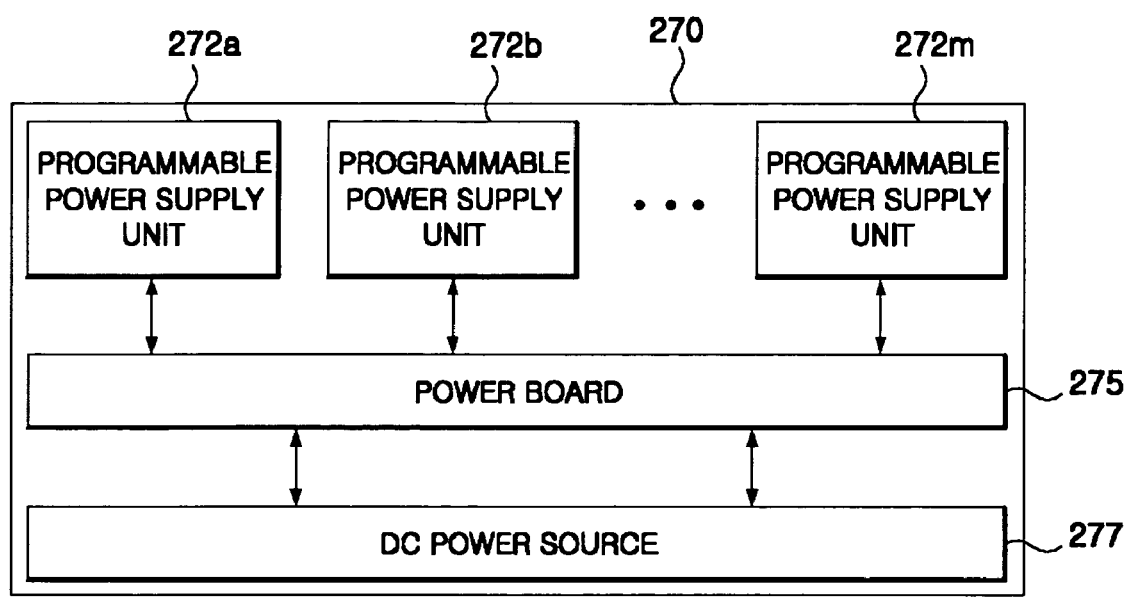
FIG. 6 is a block diagram of a power supply unit of the semiconductor test apparatus for simultaneously testing a plurality of semiconductor devices according to the present invention.

FIG. 6 is a block diagram of a power supply unit of the semiconductor test apparatus according to the present invention.

As shown in FIG. 6, the power supply unit 270 includes a plurality of programmable power supply units 272a to 272m, a power board 275 and a DC power source 277.

The programmable power supply units 272a to 272m are connected to the power interface units 255a to 255m of the backplane board 250 in a wired manner, thus supplying power having a plurality of voltages. The programmable power supply units 272a to 272m generate various voltages required to perform a test, for example, 2.5V, 3.3V, 5V, 6V, 12V, ground voltage, or −12V, and then supply the voltages.

The power board 275 functions to control the supply of power from the DC power source 277 to the programmable power supply units 272a to 272m, and mechanically support the programmable power supply units 272a to 272m.

The DC power source 277 functions to supply DC power to the power board 275.

The programmable power supply units 272a to 272m, the power board 275 and the DC power source 277 can be connected to each other through power cables.

Figure 7A:
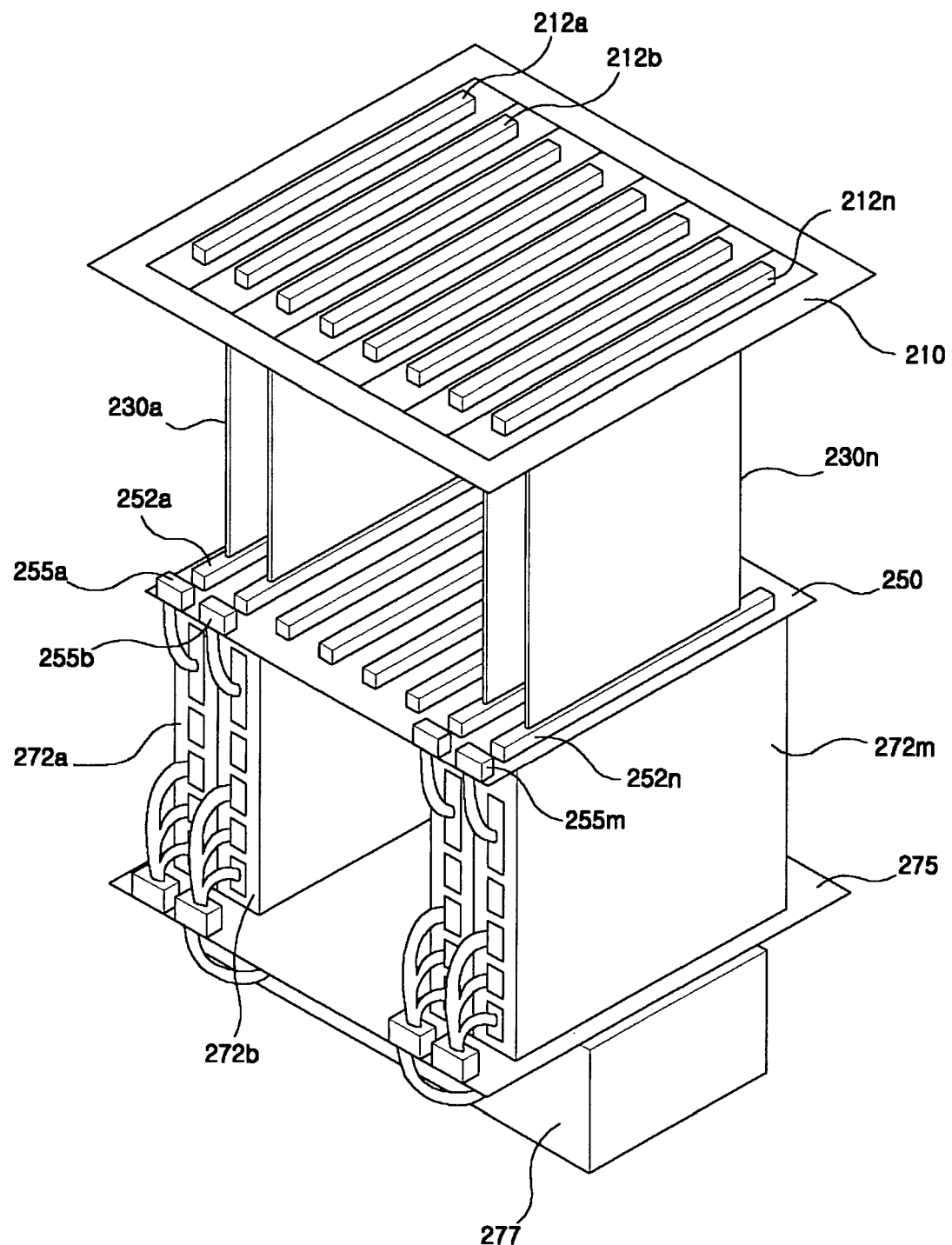
FIGS. 7a and 7b are views showing examples of the actual assembly of the semiconductor test apparatus for simultaneously testing a plurality of semiconductor devices according to the present invention.
Figure 7B:
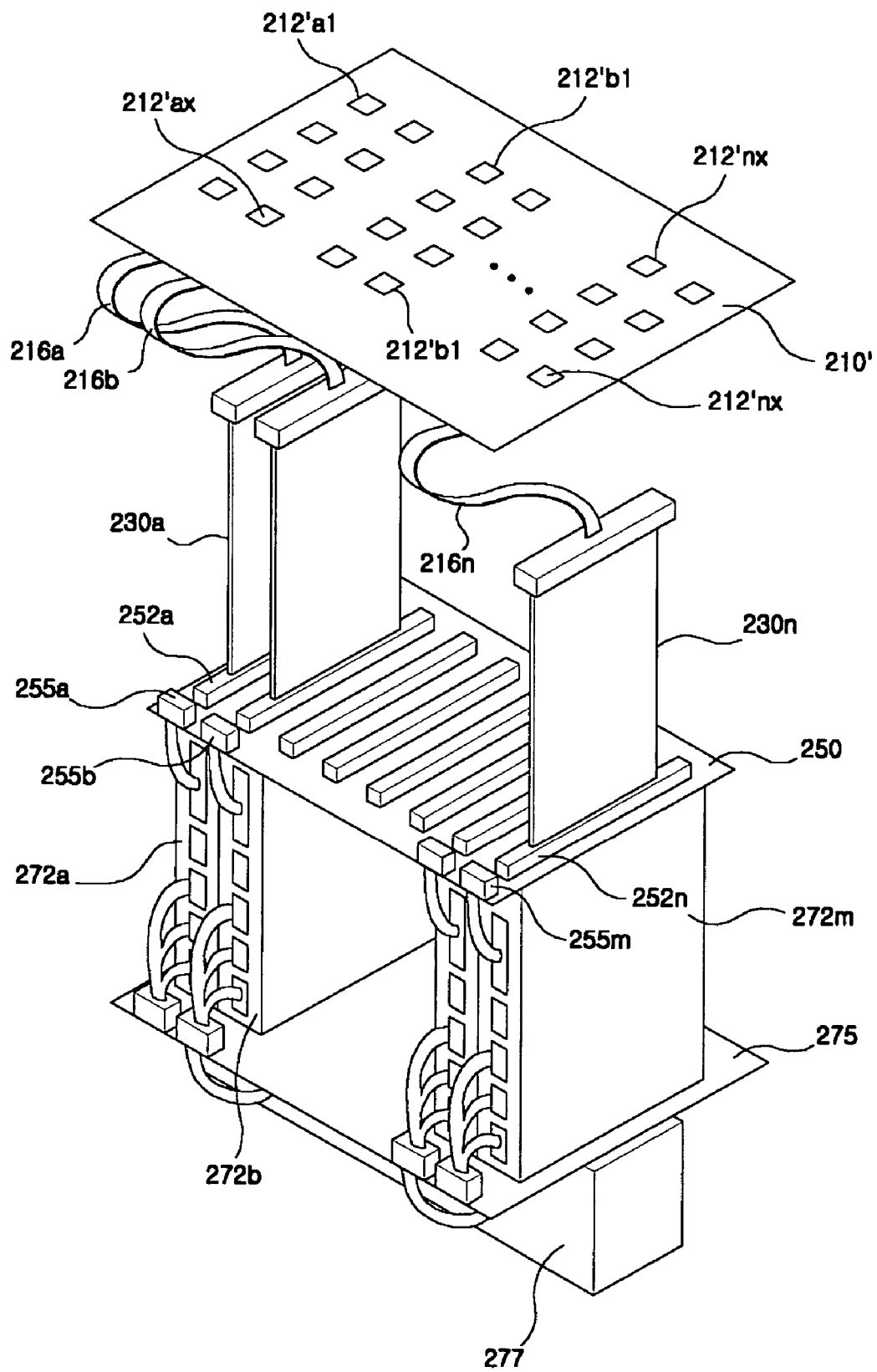

FIGS. 7a and 7b are views showing examples of the actual assembly of the semiconductor test apparatus according to the present invention. FIG. 7a illustrates an example of actual assembly when semiconductor modules are tested, and FIG. 7b illustrates an example of actual assembly when semiconductor components are tested.

As shown in FIGS. 7a and 7b, it can be seen that the DUT board 210 or 210', the plurality of pattern generation boards 230a to 230n, the backplane board 250, and the power supply unit (including the plurality of programmable power supply units 272a to 272m, the power board 275 and the DC power source 277) are assembled and constructed into a single body. Further, it can be seen that the DUT board 210 or 210' includes sockets 212a to 212n in which respective semiconductor modules are mounted, or sockets 212'a1 to 212'nx in which respective semiconductor components are mounted.

Further, the connection between the DUT board 210 or 210' and the pattern generation boards 230a to 230n is established through socket-type connectors (not shown, refer to FIG. 3) at the time of testing semiconductor modules, and is established through cable connection-type connectors (not shown, refer to FIG. 3) at the time of testing semiconductor components.

That is, at the time of testing semiconductor modules, the DUT board 210 includes a plurality of sockets 212a to 212n in which semiconductor modules are mounted. The plurality of connectors of the DUT board 210 interfaces the pattern generation boards 230a to 230n with sockets, in which semiconductor modules are mounted and which correspond to respective pattern generation boards, so as to transmit/receive signals.

Further, at the time of testing semiconductor components, the DUT board 210' includes a plurality of sockets 212'a1 to 212'nx in which semiconductor components are mounted.

The plurality of connectors of the DUT board 210' interfaces the pattern generation boards 230a to 230n with semiconductor components designated with respect to the pattern generation boards 230a to 230n so as to transmit/receive signals. In this case, the plurality of connectors of the DUT board 210 interfaces the pattern generation boards 230a to 230n with semiconductor components designated with respect to the pattern generation boards 230a to 230n through, for example, the connection of the cables 216a to 216n, so as to transmit/receive signals.

Therefore, when semiconductor modules or semiconductor components are tested, the DUT boards 210 and 210' are respectively used to test semiconductor modules and semiconductor components, so that the semiconductor modules or components can be tested.

As described above, the present invention provides a semiconductor test apparatus for simultaneously testing a plurality of semiconductor devices, which mainly performs cell and core tests and a direct current test that are most important and require the longest test time among memory tests, except for memory tests having complicated functions in a conventional memory module or memory component, for example, an alternating current margin test or timing generator, and which, in particular, simplifies the construction of conventional automated test equipment in a function test using test patterns and utilizes a programmable device, in which functions, such as pattern generation or comparison or signal application, are implemented on one chip, thus miniaturizing a semiconductor test apparatus and reducing the production cost thereof.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A semiconductor test apparatus for simultaneously testing a plurality of semiconductor devices, comprising:
   a plurality of pattern generation boards for receiving a test program from an external server, generating a test pattern signal and an expected signal, transmitting the test pattern signal to the semiconductor devices, receiving a test pattern result signal from the semiconductor devices, comparing the test pattern result signal with the expected signal, generating a Direct Current (DC) test signal and a DC test expected signal for a DC test, transmitting the DC test signal to the semiconductor devices, and receiving a DC test result signal from the semiconductor devices, comparing the DC test result signal with the DC test expected signal;
   a Device Under Test (DUT) board including a plurality of sockets for connection to the semiconductor devices and a plurality of connectors for connection to the pattern generation boards, the DUT board receiving the test pattern signal or the DC test signal from the pattern generation boards, transmitting the test pattern signal or DC test signal to the semiconductor devices, receiving the test pattern result signal or DC test result signal from the semiconductor devices, and transmitting the test pattern result signal or DC test result signal to the pattern generation boards;
   a backplane board including a plurality of connectors for connection to the plurality of pattern generation boards, the backplane board mechanically supporting the pattern generation boards, the backplane board including a communication interface unit for connection to the external server; and
   a power supply unit for mechanically supporting the backplane board and supplying power to the backplane board, wherein the power supply unit comprises:
      a plurality of programmable power supply units for supplying power having a plurality of voltages, each of the plurality of programmable power supply units being connected to a power interface unit of the backplane board;
      a power board for controlling supply of power to the plurality of programmable power supply units, the power board mechanically supporting the programmable power supply units; and
      a DC power source for supplying DC power to the power board.

2. The semiconductor test apparatus according to claim 1, wherein each of the pattern generation boards comprises:
   a programmable device for receiving the test program, generating the test pattern signal and the expected signal, transmitting the test pattern signal to a corresponding semiconductor device, receiving the test pattern result signal from the semiconductor device, and comparing the test pattern result signal with the expected signal, thus testing operation of the semiconductor device;
   a power measurement unit for generating the DC test signal and the DC test expected signal to perform the DC test, transmitting the DC test signal to the semiconductor device, receiving the DC test result signal from the semiconductor device and performing comparison with the DC test expected signal;
   a DUT interface unit including a test pattern interface that transmits the test pattern signal to the semiconductor device while minimizing signal distortion, receives the test pattern result signal from the semiconductor device and transmits the test pattern result signal to the programmable device, a power interface that transmits the DC test signal to the semiconductor device, receives the DC test result signal from the semiconductor device and transmits the DC test result signal to the power measurement unit, and a termination interface that performs termination;
   a clock generator for generating a clock and providing the clock to the programmable device;
   a Phase Locked Loop (PLL) for transmitting a clock signal having the same phase to the DUT interface unit;
   a backplane interface unit for providing an interface with the backplane board to communicate with the external server and to be supplied with power from the power supply unit; and
   a control unit for controlling operation of the programmable device, the power measurement unit, the DUT interface unit, the clock generator, the PLL and the backplane interface unit.

3. The semiconductor test apparatus according to claim 2, wherein the control unit performs control so that the power interface of the DUT interface unit is set to be ON and the test pattern interface and the termination interface are set to be OFF when the DC test is performed, and the power interface of the DUT interface unit is set to be OFF and the test pattern interface and the termination interface are set to be ON when a function test is performed.

4. The semiconductor test apparatus according to claim 1, wherein the communication interface unit is an interface satisfying a Peripheral Component Interconnect (PCI) communication standard.

5. The semiconductor test apparatus according to claim 1, wherein the DUT board comprises a plurality of sockets in which semiconductor modules are mounted, the semiconductor devices are the semiconductor modules, and the plurality of connectors of the DUT board for connection to the pattern generation boards interfaces the pattern generation boards with the sockets, in which the semiconductor modules are mounted and which correspond to respective pattern generation boards, to transmit/receive signals.

6. The semiconductor test apparatus according to claim 1, wherein the DUT board comprises a plurality of sockets in which semiconductor components are mounted, the semiconductor devices are the semiconductor components, and the plurality of connectors of the DUT board for connection to the pattern generation boards interfaces the pattern generation boards with semiconductor components designated with respect to the pattern generation boards through cable connections to transmit/receive signals.

* * * * *